United States Patent [19]
Naura

[11] Patent Number: 6,040,994
[45] Date of Patent: Mar. 21, 2000

[54] METHOD FOR WRITING IN AN ELECTRICALLY MODIFIABLE NON-VOLATILE MEMORY

[75] Inventor: David Naura, Aix en Provence, France

[73] Assignee: STMicroelectronics S.A., Gentilly, France

[21] Appl. No.: 09/179,621

[22] Filed: Oct. 27, 1998

[30] Foreign Application Priority Data

Oct. 28, 1997 [FR] France ................................ 97 13740

[51] Int. Cl.[7] .................................................. G11C 16/00
[52] U.S. Cl. ............................ 365/185.18; 365/185.19; 365/185.28; 365/185.29
[58] Field of Search ..................... 365/185.18, 185.19, 365/185.28, 185.05, 185.29

[56] References Cited

U.S. PATENT DOCUMENTS

| | | |
|---|---|---|
| 4,912,749 | 3/1990 | Maruyama et al. ............... 365/185.18 |
| 4,953,129 | 8/1990 | Kobayashi et al. ..................... 365/203 |
| 5,040,147 | 8/1991 | Yosnizawa et al. ............... 365/185.18 |
| 5,218,568 | 6/1993 | Lin et al. ........................... 365/185.18 |
| 5,251,169 | 10/1993 | Josephon ............................. 365/185.18 |
| 5,363,330 | 11/1994 | Kobayashi et al. ..................... 365/185 |
| 5,912,842 | 6/1999 | Chang et al. ...................... 365/185.18 |
| 5,949,709 | 9/1999 | Birnie ................................. 365/185.18 |

FOREIGN PATENT DOCUMENTS 0 311 137 A2  10/1988  European Pat. Off. ........ G11C 17/00

*Primary Examiner*—Tan T. Nguyen
*Attorney, Agent, or Firm*—Theodore E. Galanthay; Allen, Dyer, Doppelt, Milbrath & Gilchrist, P.A.

[57] ABSTRACT

A method for writing in an electrically erasable and programmable non-volatile memory (EEPROM, Flash EEPROM) includes keeping a gate of a selection transistor at its maximum value for the erasure or programming of a memory cell, so long as the potential at a drain or source of the transistor is not zero or at a very low level. This increases the lifetime of the selection transistors.

34 Claims, 5 Drawing Sheets

METHOD FOR WRITING IN AN ELECTRICALLY MODIFIABLE NON-VOLATILE MEMORY

FIELD OF THE INVENTION

The present invention relates to the field of memory devices, and more particularly, to a method of writing in an electrically erasable and programmable non-volatile memory (EEPROM or Flash EEPROM), and to a memory device implementing this method.

BACKGROUND OF THE INVENTION

An erasable and programmable non-volatile memory, such as an EPROM, is typically formed as an integrated circuit and comprises an array of memory cells, means for selecting these cells, as well as means to program and read them. The cells of the array are organized in a matrix of columns and rows. The memory cells of one and the same column are connected to a bit line, and the memory cells of one and the same row are connected to a word line. The memory cells may be in a programmed state in which they pass an electrical current, or in an erased state in which they oppose the passage of this current.

Each memory cell includes a selection transistor and a floating-gate transistor. The information on the state of the memory cell is determined via a trapped charge stored in the floating-gate transistor. Thus, the memory cell is erased if a floating gate of the corresponding transistor is charged with electrons. Conversely, the memory cell is programmed if the floating gate is depleted of electrons. The charging and discharging of the floating gate is obtained by applying a high voltage to the gate or drain of the floating-gate transistor of the memory cell to be written in. This high voltage, in a range of about 15–20 volts, is provided by a high-voltage generator.

A simplified drawing of a prior art EEPROM is shown in FIG. 1. For the sake of clarity, this drawing has only one memory cell CM. This cell has a selection transistor TS and a floating-gate transistor TGF series-connected between a bit line LB and ground. The gate of the selection transistor TS is connected to a word line LM, while the drain is connected to the bit line LB.

The selection of the memory cell is done by means of a row decoder DL and a column decoder DC. These decoders decode the address signals A1, A2, A3, A4 and A5. The row decoder DL enables the selection of a word line, such as the word line LM. The column decoder DC enables the connection of the bit line LB to a pin P1 or to a read circuit CL by means of a transistor T1. The pin P1 receives a voltage signal Vp1. These decoders DC and DL also control two other transistors, T2 and T3 respectively, which are series-connected between a pin P2 and the gate of the floating-gate transistor TGF. A voltage signal Vp2 is applied to the pin P2. These transistors are designed to provide the voltage signal Vp2 to the gate of the transistor TGF. Furthermore, the decoders DC and DL are supplied by a voltage signal Vpp provided by a voltage ramp generator. In the following description, the references VLM, V2 and V1 designate the voltage signals respectively applied to the word line LM, to the gate, and to the drain of the floating-gate transistor TGF.

A write operation in an EEPROM memory conventionally requires an erasure cycle and a programming cycle. The erasure cycle performs a zero-setting (or an erasure) of all the cells of the word to be written and the programming cycle performs a one-setting of the cells corresponding to the non-zero bits of the word to be written.

A write operation in the memory cell CM is illustrated by the timing diagrams of the signals vpp, VLM, Vp2 and Vp1 shown in FIGS. 2a through 2d. In a first phase (erasure cycle) the cell CM is erased, and in a second phase (programming cycle) the cell CM is programmed. At each cycle, the ramp generator is put into operation and generates the voltage signal Vpp as shown in FIG. 2a. The voltage signal Vpp has a rising phase during which the voltage climbs from a reference voltage up to a voltage plateau Vh. During the voltage plateau, the voltage is held at this level. The voltage signal Vpp has a decreasing phase when the voltage returns to its reference value. Since the signals VLM, Vp2, Vp1 are derived from the signal Vpp, they have the same shape as the signal Vpp when they are not at a zero level. The initial reference voltage of the signal Vpp is equal to the supply voltage of the memory (about 5 volts), whereas it is zero for the signals VLM, Vp2 and Vp1. Furthermore, the plateau of these signals is at a voltage typically equal to 18 volts. The voltage signals Vp1 and Vp2 are set at zero respectively during the erasure cycle and the programming cycle.

FIGS. 2e and 2f show the timing diagrams of the voltages V2 and V1 respectively applied to the gate and drain of the transistor TGF during a write operation. These timing diagrams are nearly identical to the timing diagrams of the signals Vp2 and Vp1, except for two differences: 1) the maximum voltage of the signals V2 and V1 (about 16 volts) is slightly smaller than that of the signals Vp2 and Vp1, with a small loss in voltage occurring at the terminals of the selection transistors T1, T2, T3 and TS; and 2) the return to the reference voltage is slower due to the high capacitive load of the selection transistors T3 and TS.

A slow discharge of the transistors T3 and TS may weaken them and cause deterioration. While the gate potential of the transistor TS or T3 goes from about 18 volts to 0 volts, the source potential falls by only a few volts, from about 16 volts to 10 volts.

As a result of the slow discharge of transistor T3 or TS, and the level of change in voltage potentials to the gate and the source, two phenomena occur. First, the difference in potential between the gate electrode and the source electrode of the transistor T3 in the event of erasure (or of the transistor TS in the event of programming) changes polarity from +2 volts to −10 volts, and then falls back to 0 volts. The crossing of the potentials then prompts an injection of hot electrons into the gate oxide of this transistor. The second phenomenon occurs at the end of the drop in voltage VLM (equal to a few volts). The voltage applied to the drain of the transistor T3 (or TS) remains high, and an avalanche effect occurs at the drain of this transistor, thus prompting a high substrate current.

These two phenomena tend to weaken the gate oxide layer of the selection transistors. Since the EEPROM type memories are generally required to undergo a very large number of write cycles, this raises a problem of reliability with respect to the memory.

SUMMARY OF THE INVENTION

An object of the invention is to provide a method of writing in an electrically erasable and programmable non-volatile memory by keeping a gate of a selection transistor at its maximum value, so long as the potential at a drain or a source of the transistor is not zero or at a very low level (some hundreds of millivolts). Thus, the gate potential of the selection transistor is always greater than the gate potential at the drain and the avalanche effect, as well as the potential crossing mentioned above are eliminated.

An electrically erasable and programmable non-volatile memory in accordance with the present invention comprises memory cells that are read addressable and write addressable by means of word lines and bit lines. Each memory cell comprises a floating-gate transistor series-connected with a selection transistor between a bit line and ground. The method according to the invention comprises the steps of selecting a memory cell by applying a first voltage signal to a word line connected to the selection transistor of the memory cell. For erasure of the memory cell, a second voltage signal is simultaneously applied to the control gate of the floating-gate transistor of the memory cell. For programming of the memory cell, a third voltage signal is applied simultaneously to the drain of the floating-gate transistor of the memory cell. The three voltage signals each comprises a rising phase, a voltage plateau and a drop in voltage, wherein the voltage plateau of the first voltage signal is maintained for a time t1. Time t1 is measured from the starting point of the rising phase and is greater than the corresponding times t2 and t3 for the second and third voltage signals. According to a first characteristic, the time t1 is equal to the times t2 or t3 plus an additional fixed duration.

As an alternative embodiment, the voltage plateau of the first voltage signal in the case of an erasure is maintained until the potential applied to the gate of the floating-gate transistor is smaller than a threshold value, preferably a few hundred millivolts. Similarly, the voltage plateau of the first voltage signal in the case of programming is maintained until the potential applied to the drain of the floating-gate transistor is smaller than a threshold value, preferably a few hundred millivolts.

Another object of the invention is to provide a non-volatile memory device that implements the above methods. According to a first embodiment device, the three voltage signals Vpp, Vp1 and Vp2 are modified directly in the device for producing the signals. In particular, an electrically modifiable non-volatile memory comprises an array of memory cells that are read addressable and write addressable by word lines and bit lines, each memory cell comprising a selection transistor that is series-connected with a floating-gate transistor between a bit line and ground. A voltage generator provides for the simultaneous production of a first voltage signal designed to select a memory cell, and a second voltage signal or a third voltage signal depending on whether the memory cell selected is to be erased or programmed.

The first voltage signal is applied to the word line attached to the memory cell to be selected. The second voltage signal is applied to the gate of the floating-gate transistor of the memory when the memory cell is to be erased. The third voltage signal is applied to the drain of the floating-gate transistor of the memory when the memory cell is to be programmed. Each of the three voltage signals comprises a rising phase, a voltage plateau and a voltage drop. The voltage generator comprises means for holding the voltage plateau of the first voltage signal for a time t1, measured from the starting point of its rising phase, which is greater than the corresponding times t2 and t3 for the second and third voltage signals.

According to a second embodiment, the signals Vpp, Vp1 and Vp2 are modified by means ancillary to the device for producing the signals. That is, the voltage signals are modified after they are generated, but before they are applied to the memory cell. An electrically modifiable non-volatile memory comprises an array of memory cells that are read addressable and write addressable by word lines and bit lines, each memory cell comprises a selection transistor series-connected with a floating-gate transistor between a bit line and the ground. A voltage generator provides for the simultaneous production of a first voltage signal to select a memory cell, and a second voltage signal or a third voltage signal depending on whether the memory cell selected is to be erased or programmed. The first voltage signal is applied to the word line attached to the memory cell to be selected. If the memory cell is to be erased, the second voltage signal is applied to the gate of the floating-gate transistor. If the memory cell is to be programmed, the third voltage signal is applied to the drain of the floating-gate transistor. The three voltage signals each comprise a rising phase, a voltage plateau and a voltage drop. The memory further comprises means to limit the size of the voltage plateau of the second and third voltage signals before applying them respectively to the gate or drain of the floating-gate transistor.

BRIEF DESCRIPTION OF THE DRAWINGS

Other features and advantages of the invention shall appear from the following detailed description made with reference to the appended drawings, of which.

DETAILED DESCRIPTION OF THE PREFERRED EMBODIMENTS

Figure 2A:
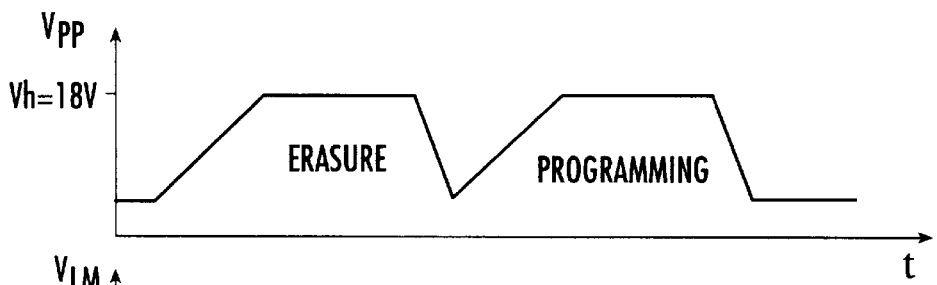
FIGS. 2a–2f illustrate timing diagrams of the signals Vpp, VLM, Vp2, Vp1, V2 and V1 in a standard EEPROM according to the prior art.
Figure 2B:
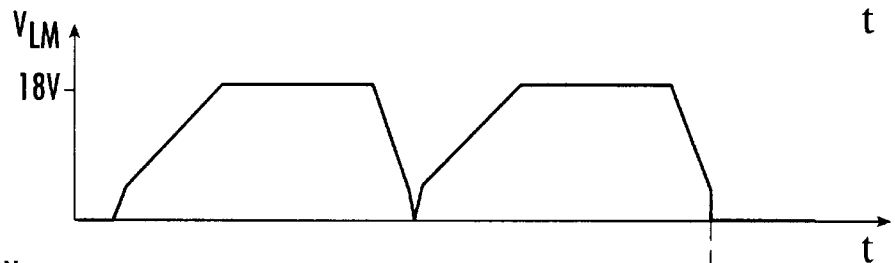
Figure 2C:
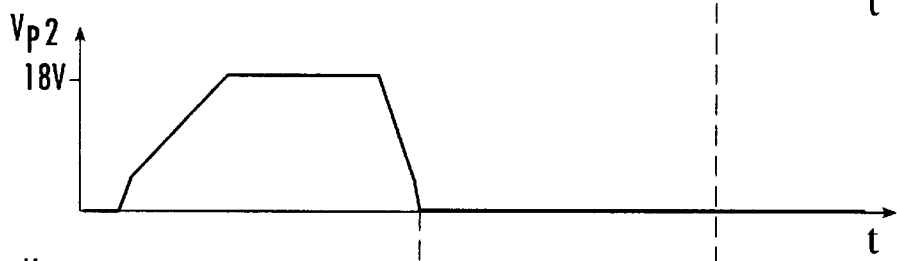
Figure 2D:
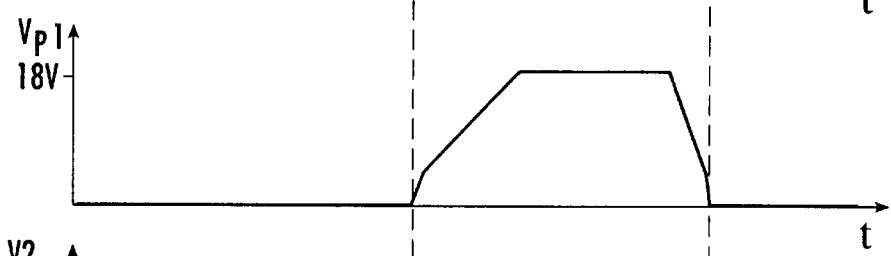
Figure 2E:
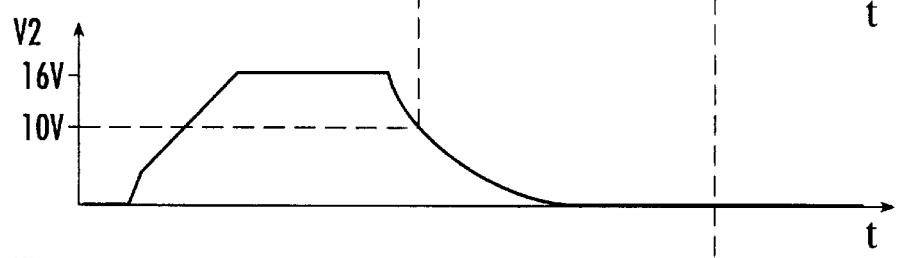
Figure 2F:
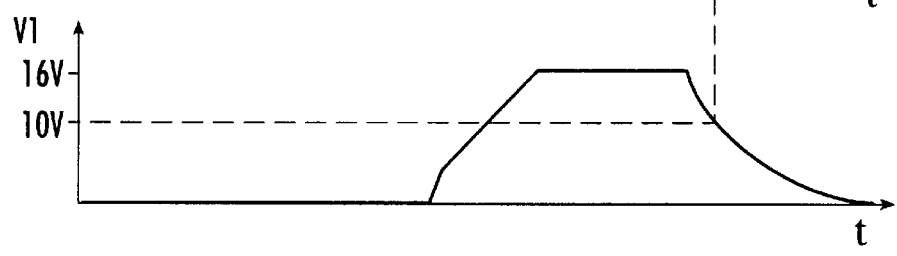

A plateau of voltage of a signal VLM is maintained so long as potential V2 applied to a gate of a transistor TGF (in the event of erasure) or the potential V1 applied to a drain of transistor TGF (in the event of programming) is not zero or a very low voltage. To maintain the plateau of a signal VLM in the event of an erasure or programming, two approaches are presented. A first uses the ramp generator of the memory to directly generate the voltage signals Vpp, Vp1 and Vp2 with different plateau lengths. A second approach utilizes the ramp generator of the memory to generate the voltage signals Vpp, Vp1, and Vp2, as shown, respectively, in FIGS. 2a, 2d, and 2c. Means are also provided in the memory for Codifying the voltage signals Vp1 and Vp2 before applying them to the memory cell.

Figure 3A:
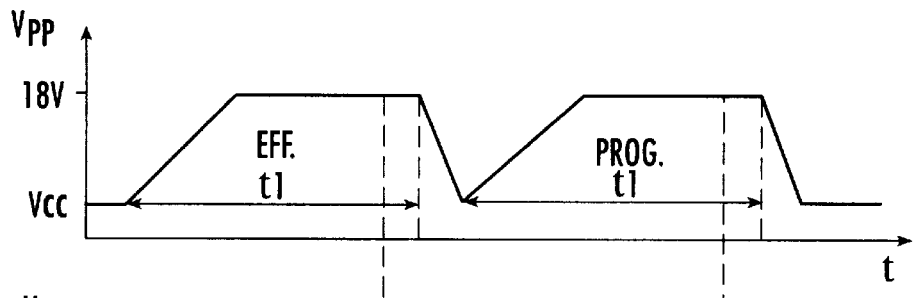
FIGS. 3a–3d illustrate timing diagrams of the signals Vpp, VLM, Vp2, Vp1 in a first embodiment of a memory device implementing a method of the invention.
Figure 3B:
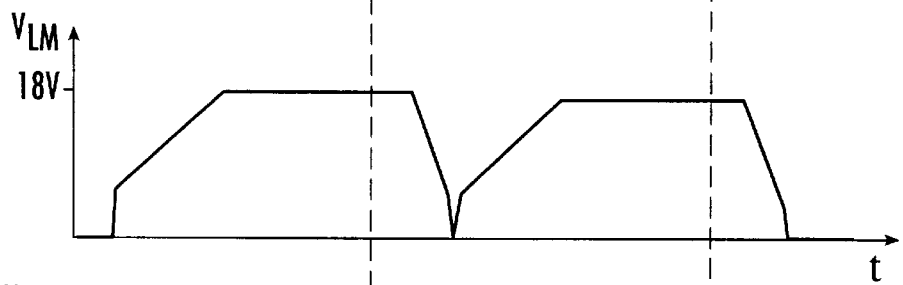

The first approach is illustrated in FIGS. 3a–3d, 4 and 5. FIG. 3a shows the voltage signal Vpp produced by the ramp generator. The voltage plateau is maintained at a maximum value for a period of time t1 measured from the starting point of its rising phase. The voltage signal VLM illustrated in FIG. 3b is identical to the signal Vpp except that the rising phase begins at zero volts and not at Vcc.

Figure 3C:
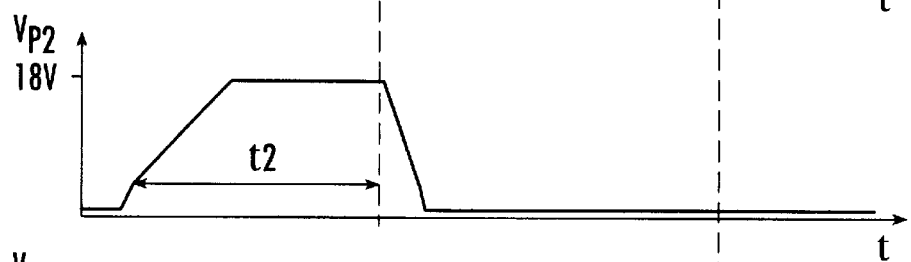

During the erasure cycle, the voltage signal Vp2 shown in FIG. 3c is active and the voltage plateau is held at 18 volts for a period of time t2. This period of time t2 is smaller than the period of time t1, and is chosen so that the total drop in voltage of the signal Vp2 is achieved during the voltage plateau of the signal VLM. Thus, since a high voltage is maintained at the gate of the selection transistor T3 during the drop in the signal Vp2, the transistor T3 is highly conductive and its capacitive load no longer slows down the drop in potential at the gate of the floating-gate transistor. The voltage signal V2 applied to the gate of the transistor TGF is identical to the signal Vp2 (plus or minus about 1 or 2 volts).

Figure 3D:
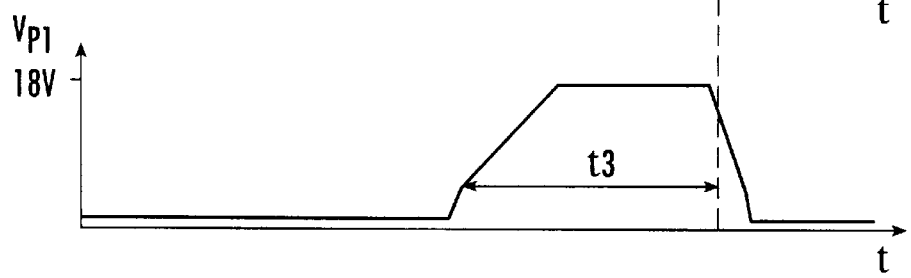

Similarly, during the programming cycle, the voltage signal Vp1 shown in FIG. 3d is active and its voltage plateau is maintained at 18 volts during a period of time t3. This period of time t3 is smaller than the time t1 and is chosen so that the total drop in voltage of the signal Vp1 is achieved during the voltage plateau of the signal VLM. Thus, the capacitive load of the transistor TS no longer slows down the drop in potential at the drain of the floating-gate transistor, and the voltage signal V1 applied to the drain of the transistor TGF is identical to the signal Vp1 (plus or minus about 1 or 2 volts).

Figure 4:
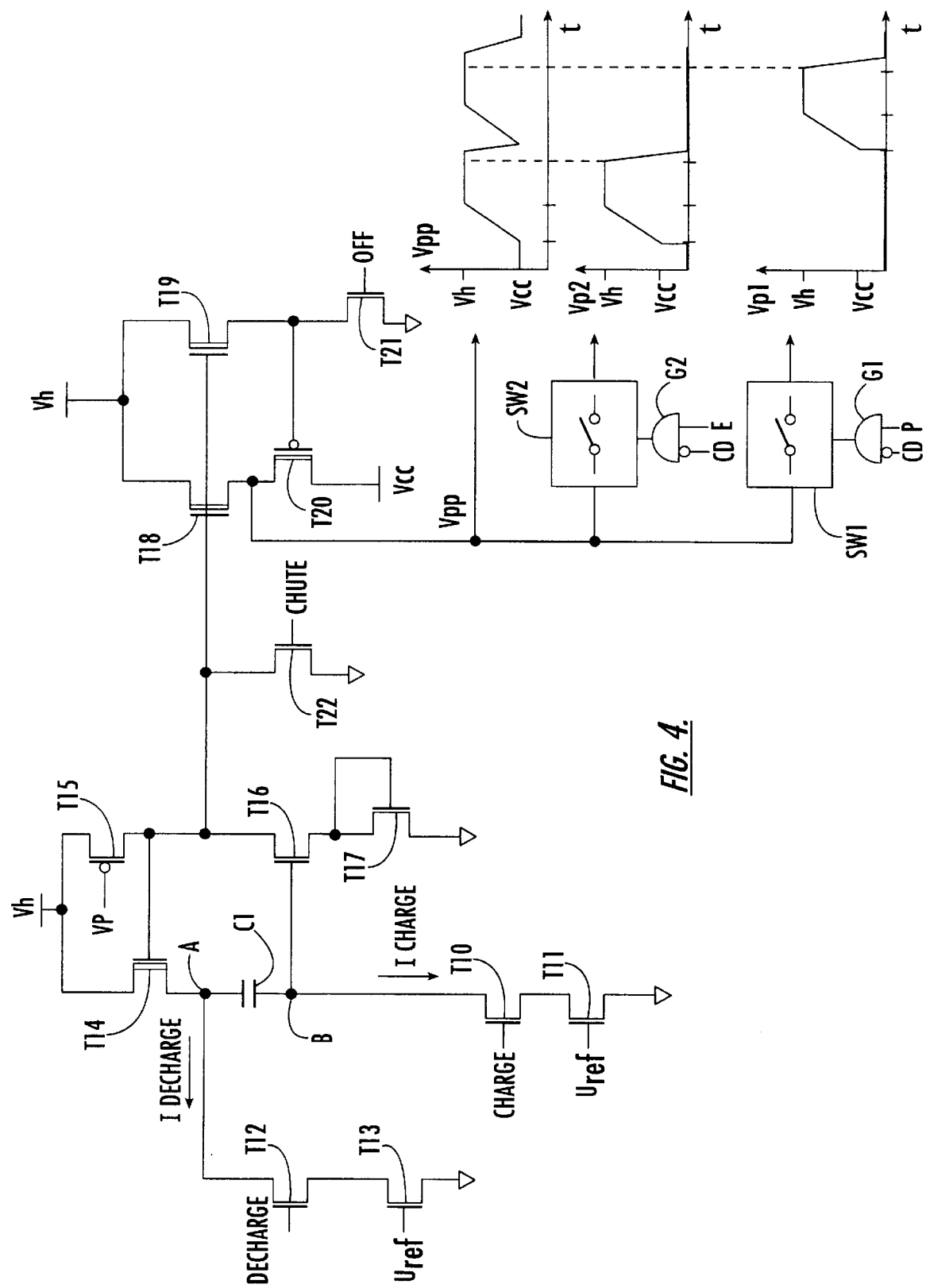
FIG. 4 illustrates a diagram of a voltage ramp generator generating the signals of FIGS. 3a–3d.

FIG. 4 shows a voltage ramp generator configured to deliver the voltage signals Vp1, Vp2 and Vpp as shown, respectively, in FIGS. 3d, 3c and 3a. This voltage ramp generator conventionally has a capacitor C1 that is charged or discharged by means of a charging circuit and a discharging circuit. The charging circuit comprises a switching transistor T10 controlled by the signal CHARGE and a transistor T11 used to set the charging current of the capacitor C1. These two transistors are series-connected between the lower terminal of the capacitor and ground. In order for the charging current to be constant, transistor T11 is controlled by a constant voltage Uref. The signal CHARGE is active during the charging of the capacitor C1.

Identically, the discharging circuit comprises a switching transistor T12 controlled by a signal DISCHARGE and a transistor T13 to set the discharging current of the capacitor C1. These two transistors are series-connected between the upper terminal of the capacitor and ground. The transistor T13 is controlled by the voltage Uref. The signal DISCHARGE is active during the discharging of the capacitor C1.

The ramp generator further comprises a circuit to regulate the charging current of the capacitor C1. This circuit has four transistors T14, T15, T16 and T17. The transistor T14 is an N-channel MOS transistor having a source connected to an upper terminal of the capacitor C1 and a drain supplied by a high voltage Vh. The transistor T15 is a P-channel MOS transistor having a source and drain respectively connected to the drain and to the gate of the transistor T14. A gate of transistor T15 receives a biasing voltage VP.

The transistor T16 is an N-channel MOS transistor having a gate connected to the lower terminal of the capacitor C1 and a drain connected to the drain of the transistor T15. The source of the transistor T16 is connected to ground by means of a diode-mounted transistor T17. The transistor T17 functions as a resistor. The regulation of the current is performed as follows: if the charging current diminishes, the potential at the lower terminal of the capacitor C1 diminishes and the transistor T16 becomes more resistive. The potential at the gate of the transistor T14 then increases, and the transistor T14 becomes less resistive and the charging current increases.

The ramp generator also comprises a circuit producing the reference voltage of the voltage signal Vpp. In this embodiment, the reference voltage is equal to the supply voltage Vcc of the memory. This circuit has two N-channel MOS transistors T18 and T19 each having a drain supplied by the voltage Vh and each having a gate connected to the drain of the transistor T16 of the regulation circuit. A source of the transistor T18 is connected to a supply voltage Vcc by means of a P-channel MOS transistor T20. The gate of the transistor T20 is connected to the source of the transistor T19. Thus, when the gate voltage of the transistors T18 and T19 are low, the transistor T20 is on and provides the voltage Vcc on the source of the transistor T18. An additional N-channel transistor T21 cancels the voltage Vpp when the circuit is deactivated (the signal OFF is in the high state). The voltage signal Vpp is taken at the source of the transistor T18.

The ramp generator also includes a transistor T22 configured to cause a drop in the voltage at the end of the voltage plateau. Transistor T22 is connected between the drain of the transistor T16 and ground, and is controlled by a voltage signal DROP that is active during a drop in voltage of the signal Vpp.

Finally, the voltage signal Vpp present at the source of the transistor T18 is processed by two switches SW1 and SW2 to respectively generate the signals Vp1 and Vp2. The switch SW2 is controlled by a signal coming from an AND logic gate G2. This gate has two inputs which receive an erasure signal E that is active during an erasure cycle and an inverted control signal CD. Similarly, the switch SW1 is controlled by a signal coming from an AND logic gate G1. This logic gate has two inputs which receive a programming signal P that is active during a programming cycle and the inverted control signal CD. The signal CD is active during the end of the voltage plateau and during the drop in the signal Vpp.

Figure 5:
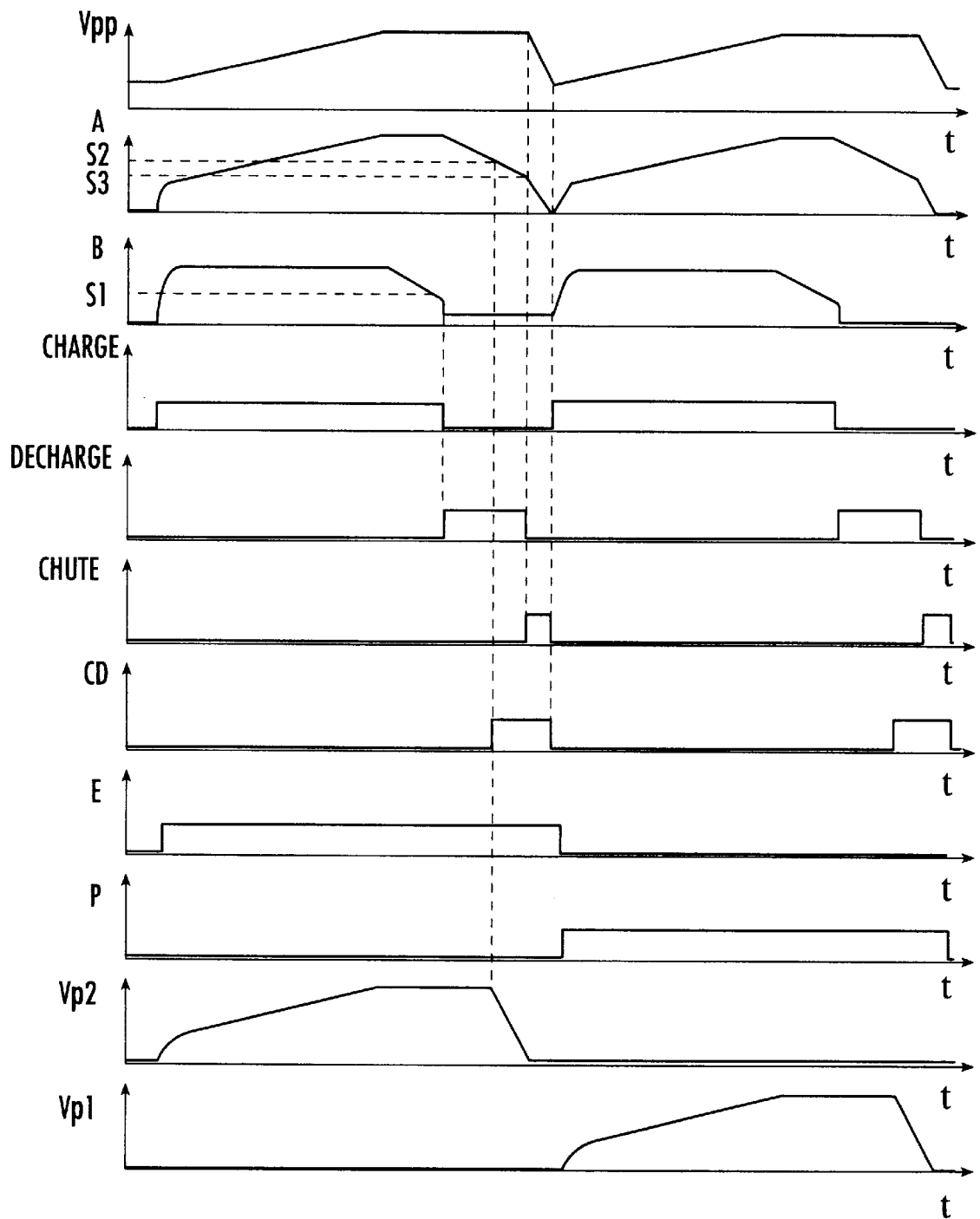
FIG. 5 illustrates timing diagrams for the ramp generator of FIG. 4.

The timing diagrams of the main signals utilized in the operation of the generator of FIG. 4 are shown in FIG. 5. Signals A and B respectively designate the potentials at the upper terminal and lower terminal of the capacitor C1. During the erasure cycle, the signal E is active. At the beginning of the charging, the signal CHARGE is activated and the potentials A and B increase as the capacitor C1 is charged. The signal Vpp increases as the potential A increases. When the potential A reaches a maximum value, the potential B starts dropping in order to continue charging the capacitor C1. When the potential B drops below a threshold value S1, potential B deactivates the signal CHARGE and activates the signal DISCHARGE. The discharging of the capacitor C1 begins.

The potential A decreases as and when the capacitor C1 is discharged. The potential B then goes to 0 volts by means of a transistor (not shown) that is voltage-controlled by the signal DISCHARGE and connected between the lower terminal of the capacitor C1 and ground. The signal Vpp is held at its maximum value when the transistor T16 is off. The passing of the potential A to a level below a threshold value S2 activates the signal CD. The switch SW2 opens and the signal Vp2 goes to zero. The passing of the potential A to a level below another threshold value S3 lower than S2 activates the signal DROP. The voltage signal Vpp drops and when the capacitor C1 is completely discharged, the signals DROP and CD are deactivated. For a programming cycle, the working of the generator is identical except that the signals E and Vp2 are replaced by the signals P and Vp1.

Thus, the steady voltage level of the signal Vpp is held for an additional period of time with respect to the plateau of the signals Vp1 and Vp2. This additional period of time is adjusted by the threshold value S2. Through the generation of signals Vpp, Vp1 and Vp2, it becomes possible to increase the lifetime of the selection transistors TS and T3.

Figure 1:
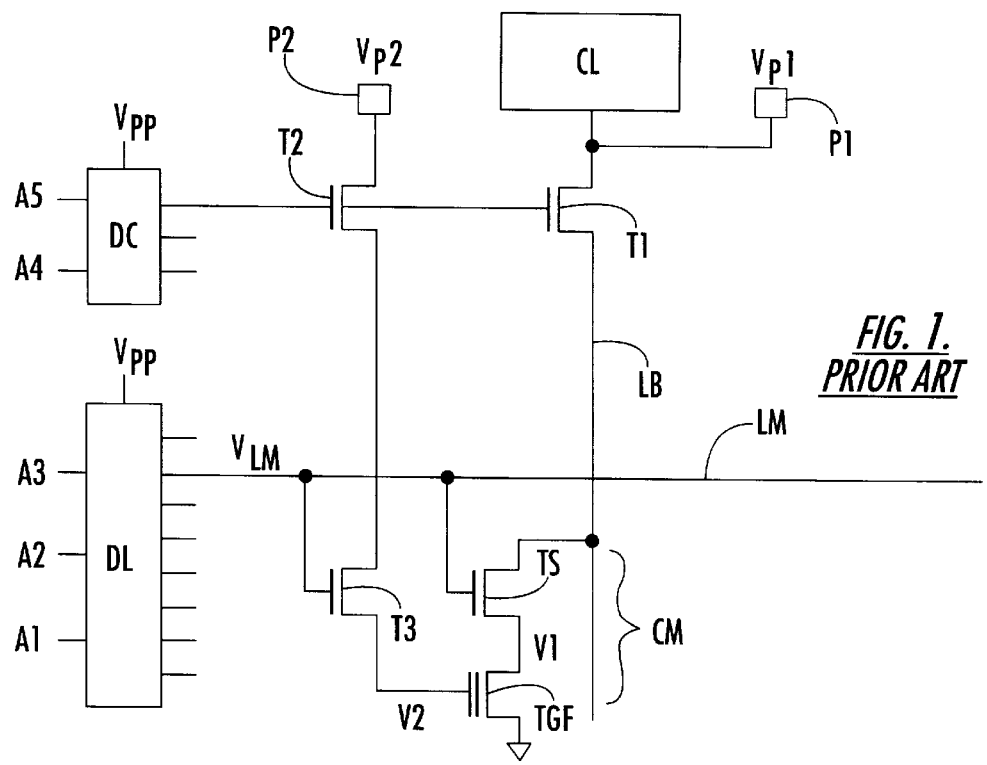
FIG. 1 illustrates a simplified diagram of a standard EEPROM according to the prior art.
Figure 6:
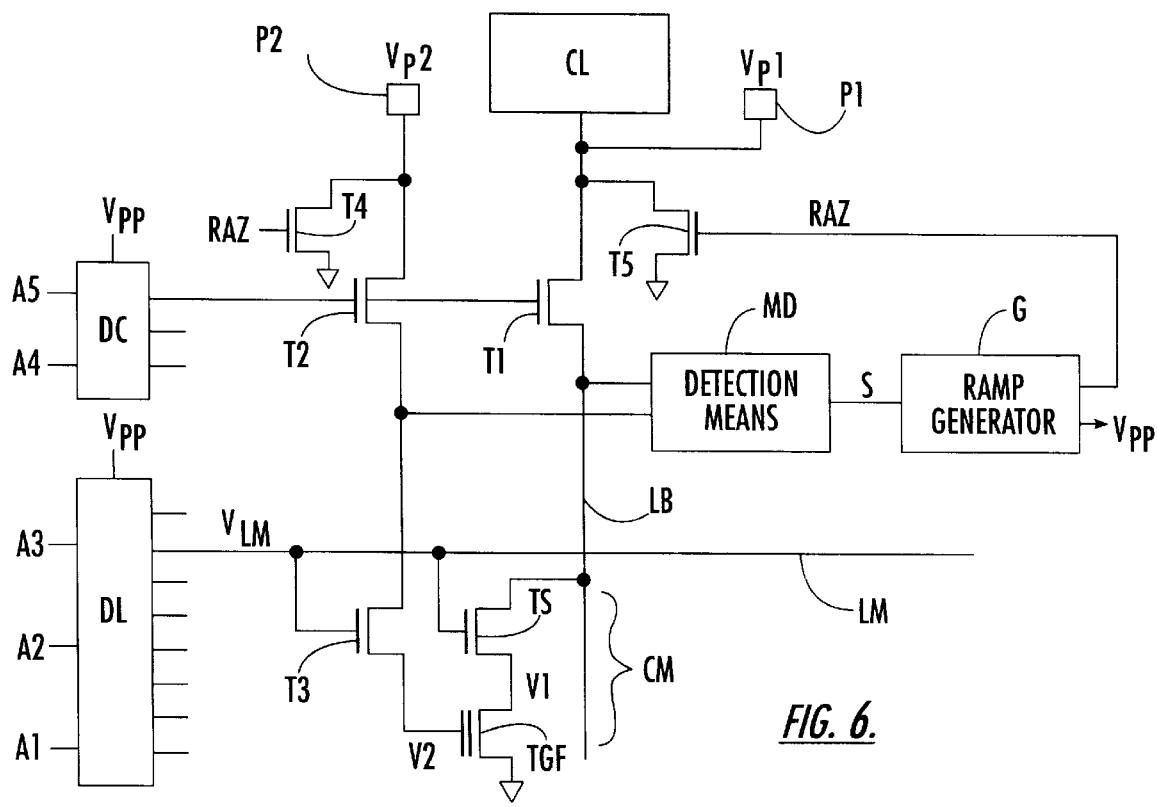
FIG. 6 illustrates a second embodiment of a memory device implementing a method of the invention.

Another approach is shown in FIG. 6. Instead of modifying the signals Vpp, Vp1 and Vp2, the potential at the gate or at the drain of the transistor TGF is cancelled by ancillary means during the end of the voltage plateau of the signal Vpp, and then activate a drop in voltage of the signal Vpp when this potential is zero or very low. In FIG. 6, the memory includes detection means MD delivering a signal S representing the state of the potential of the gate of the transistor TGF during the erasure cycle and the state of the potential of the drain during the write cycle. Signal S is a high level if this potential is zero or a very low level during the corresponding cycle.

The signal S is then applied to a control input of a ramp generator G of the memory. This generator is used for the production, in addition to the voltage signals Vpp, Vp1 and Vp2, of a signal RAZ to control two transistors T4 and T5. These transistors T4 and T5 have the respective roles of canceling the potential applied to the gate of the transistor TGF during an erasure cycle and canceling the potential applied to the drain during a programming cycle. The signal RAZ is activated about a few hundred microseconds after the beginning of the plateau of the signal Vpp, e.g., when the potential A is smaller than the threshold value S3 (FIG. 5). Furthermore, the drop in voltage of the signal Vpp is activated by the signal S.

Thus, during an erasure cycle, the signal Vpp increases in voltage and reaches its maximum value. At the end of a certain period of time, the signal RAZ becomes active and the potential applied to the gate of the transistor TGF begins to drop. As soon as the potential goes below a threshold set at about several hundred millivolts, the signal S becomes active and activates the decreasing phase of the signal Vpp. Similarly, during a programming cycle, when the signal RAZ becomes active, the potential applied to the drain of the transistor TGF begins to drop. As soon as this potential goes below a threshold set at about several hundred millivolts, the signal S becomes active and activates the decreasing phase of the signal Vpp.

The approach of FIG. 6 requires the addition of as many transistors T4, T5 and detection means as there are bit lines (or packets of bit lines). In the first embodiment (FIG. 4), only the ramp generator is modified, thus enabling the size of the memory to be optimized.

That which is claimed is:

1. A method for erasing in an electrically erasable and programmable non-volatile memory device comprising memory cells that are read addressable and write addressable by word lines and bit lines, each memory cell comprising a floating-gate transistor that is series-connected with a selection transistor between a bit line and ground, the method comprising the steps of:

selecting a memory cell by applying a first voltage signal to a word line connected to a selection transistor of a memory cell; and simultaneously applying a second voltage signal to a control gate of the floating-gate transistor of the memory cell when the memory cell is being erased;

the two voltage signals each comprising a rising phase in voltage, a voltage plateau and a decreasing phase in voltage, a duration of the voltage plateau of the first voltage signal being maintained for a time t1 measured from a starting point of the rising phase which is greater than a corresponding time t2 for the second voltage signal.

2. A method according to claim 1, wherein the time t1 is equal to the time t2 plus a predetermined additional time.

3. A method according to claim 1, further comprising the step of maintaining the duration of the voltage plateau of the first voltage signal until a voltage applied to the gate of the floating-gate transistor is smaller than a threshold value when the memory cell is being erased.

4. A method according to claim 3, wherein the threshold value is set at about several hundred millivolts.

5. A method according to claim 1, further comprising the steps of:

charging a capacitor; and discharging the capacitor, wherein the first and second voltage signals are generated based upon a voltage threshold corresponding to a first terminal and a second terminal of the capacitor and by varying voltage levels applied to the first and second terminals when the capacitor is charged and discharged, the duration of the plateau of the first voltage signal being set greater than the corresponding duration time for the second voltage signal.

6. A method for writing in an electrically erasable and programmable non-volatile memory device comprising memory cells that are read addressable and write addressable by word lines and bit lines, each memory cell comprising a floating-gate transistor that is series-connected with a selection transistor between a bit line and ground, the method comprising the steps of:

selecting a memory cell by applying a first voltage signal to a word line connected to a selection transistor of a memory cell; and simultaneously applying a third voltage signal to a drain of the floating-gate transistor of the memory cell when the memory cell is being programmed, the two voltage signals each comprising a rising phase in voltage, a voltage plateau and a decreasing phase in voltage, a duration of the voltage plateau of the first voltage signal being maintained for a time t1 measured from a starting point of the rising phase which is greater than a corresponding time t3 for the third voltage signal.

7. A method according to claim 6, wherein the time t1 is equal to the time t3 plus a predetermined additional time.

8. A method according to claim 6, further comprising the step of maintaining the duration of the voltage plateau of the first voltage signal until a voltage applied to the drain of the floating-gate transistor is smaller than a threshold value when the memory cell is being programmed.

9. A method according to claim 8, wherein the threshold value is set at about several hundred millivolts.

10. A method according to claim 6, further comprising the steps of:

charging a capacitor; and discharging the capacitor, wherein the first and third voltage signals are generated based upon a voltage threshold corresponding to a first terminal and a second terminal of the capacitor-and by varying voltage levels applied to the first and second terminals when the capacitor is charged and discharged, the duration of the plateau of the first voltage signal being set greater than the corresponding duration times for the third voltage signal.

11. A method of erasing in an electrically erasable and programmable non-volatile memory device comprising memory cells that are read addressable and write addressable by word lines and bit lines, each memory cell comprising a floating-gate transistor that is series-connected with a selection transistor between a bit line and ground, the method comprising the steps of:

selecting a memory cell by applying a first voltage signal to a word line connected to the selection transistor of the memory cell;

simultaneously applying a second voltage signal to a control gate of the floating-gate transistor of the memory cell when the memory cell is being erased;

the two voltage signals each comprising a rising phase in voltage, a voltage plateau and a decreasing phase in voltage; and maintaining a duration of the voltage plateau of the first voltage signal until a voltage applied to the gate of the floating-gate transistor is smaller than a threshold value when the memory cell is being erased.

12. A method according to claim 11, wherein the threshold value is set at about several hundred millivolts.

13. A method according to claim 11, further comprising the steps of:

charging a capacitor; and discharging the capacitor, wherein the first and second voltage signals are generated based upon a voltage threshold corresponding to a first terminal and a second terminal of the capacitor and by varying voltage levels applied to the first and second terminals when the capacitor is charged and discharged, the duration of the plateau of the first voltage signal is set greater than the corresponding duration time for the second voltage signal.

14. A method of writing in an electrically erasable and programmable non-volatile memory device comprising memory cells that are read addressable and write addressable by word lines and bit lines, each memory cell comprising a floating-gate transistor that is series-connected with a selection transistor between a bit line and ground, the method comprising the steps of:

selecting a memory cell by applying a first voltage signal to a word line connected to the selection transistor of the memory cell;

simultaneously applying a third voltage signal to a drain of the floating-gate transistor of the memory cell when the memory cell is being programmed;

the two voltage signals each comprising a rising phase in voltage, a voltage plateau and a decreasing phase in voltage; and maintaining a duration of the voltage plateau of the first voltage signal until a voltage applied to the drain of the floating-gate transistor is smaller than a threshold value when the memory cell is being programmed.

15. A method according to claim 14, wherein the threshold value is set at about several hundred millivolts.

16. A method according to claim 14, further comprising the steps of:

charging a capacitor; and discharging the capacitor, wherein the first and third voltage signals are generated based upon a voltage threshold corresponding to a first terminal and a second terminal of the capacitor and by varying voltage levels applied to the first and second terminals when the capacitor is charged and discharged, the duration of the plateau of the first voltage signal being set greater than the corresponding duration time for the third voltage signal.

17. An electrically modifiable non-volatile memory device comprising:

an array of memory cells that are read addressable and write addressable by word lines and bit lines, each memory cell comprising a selection transistor and a floating gate transistor series-connected with the selection transistor between a bit line and ground; and a voltage generator for the simultaneous generation of a first voltage signal for selecting a memory cell and a second voltage signal when the selected memory cell is to be erased, the first voltage signal being applied to the word line connected to the memory cell to be selected and the second voltage signal being applied to a gate of the floating-gate transistor, the two voltage signals each comprising a rising phase, a voltage plateau and a voltage drop;

said voltage generator further comprising means for holding a duration of the voltage plateau of the first voltage signal for a time t1 measured from a starting point of the rising phase, which is greater than a corresponding duration time t2 for the second voltage signal.

18. An electrically modifiable non-volatile memory device according to claim 17, wherein the means for holding comprises:

a capacitor having a first terminal and a second terminal;

a charging circuit for charging the capacitor; and a discharging circuit for discharging the capacitor, wherein the first and second voltage signals are generated based upon a voltage threshold corresponding to the first terminal and the second terminal and by varying voltage levels applied to the first and second terminals when the capacitor is charged and discharged, the duration of the plateau of the first voltage signal being set greater than the corresponding duration time for the second voltage signal.

19. An electrically modifiable non-volatile memory device according to claim 18, wherein the charging circuit comprises:

a first switching transistor; and a second transistor series connected between the second terminal of the capacitor and ground for setting a charging current of the capacitor.

20. An electrically modifiable non-volatile memory device according to claim 18, wherein the discharging circuit comprises:

a third switching transistor; and a fourth transistor series-connected between the first terminal of the capacitor and ground and for setting a discharging current of the capacitor.

21. An electrically modifiable non-volatile memory device according to claim 18, further comprising a regulator circuit for regulating a charging current for the capacitor.

22. An electrically modifiable non-volatile memory device comprising:

an array of memory cells that are read addressable and write addressable by word lines and bit lines, each memory cell comprising a selection transistor and a floating gate transistor series-connected with the selection transistor between a bit line and ground; and a voltage generator for the simultaneous generation of a first voltage signal for selecting a memory cell and a third voltage signal when the selected memory cell is to be programmed, the first voltage signal being applied to the word line attached to the memory cell to be selected and the third voltage signal being applied to a drain of the floating-gate transistor when the memory cell is to be programmed, the two voltage signals each comprising a rising phase, a voltage plateau and a voltage drop;

said voltage generator further comprising means for holding a duration of the voltage plateau of the first voltage signal for a time t1 measured from a starting point of the rising phase, which is greater than corresponding duration time t3 for the third voltage signal.

23. An electrically modifiable non-volatile memory device according to claim 22, wherein the means for holding a duration of the voltage plateau of the first voltage signal comprises:

a capacitor having a first terminal and a second terminal;

a charging circuit for charging the capacitor; and a discharging circuit for discharging the capacitor, wherein the first and third voltage signals are generated based upon a voltage threshold corresponding to the first terminal and the second terminal and by varying voltage levels applied to the first and second terminals when the capacitor is charged and discharged, the duration of the plateau of the first voltage signal being set greater than the corresponding duration time for the third voltage signal.

24. An electrically modifiable non-volatile memory device according to claim 23, wherein the charging circuit comprises:

a first switching transistor; and a second transistor series connected between the second terminal of the capacitor and ground for setting a charging current of the capacitor.

25. An electrically modifiable non-volatile memory device according to claim 23, wherein the discharging circuit comprises:

a third switching transistor; and a fourth transistor series-connected between the first terminal of the capacitor and ground and for setting a discharging current of the capacitor.

26. An electrically modifiable non-volatile memory device according to claim 23, further comprising a regulator circuit for regulating a charging current for the capacitor.

27. An electrically modifiable non-volatile memory comprising:

an array of memory cells that are read addressable and write addressable by word lines and bit lines, each memory cell comprising a selection transistor and a floating gate transistor series-connected with the selection transistor between a bit line and ground;

a voltage generator for the simultaneous generation of a first voltage signal designed to select a memory cell and a second voltage signal when the memory cell selected is to be erased, the first voltage signal being applied to the word line attached to the memory cell to be selected and the second voltage signal being applied to a gate of the floating-gate transistor, the two voltage signals each comprises a rising phase, a voltage plateau and a voltage drop; and means to limit a duration of the voltage plateau of the second voltage signal before applying the second voltage signal to the gate of the floating-gate transistor.

28. An electrically modifiable non-volatile memory device according to claim 27, wherein the means to limit a duration of the voltage plateau comprises:

a detection means for generating a detection signal representative of a voltage of a gate of the floating gate transistor when the memory cell is to be erased; and a ramp generator for receiving the detection signal and for generating a control signal for canceling a voltage applied to the gate of the floating gate transistor when the memory cell is to be erased.

29. An electrically modifiable non-volatile memory device according to claim 28, further comprising a first control transistor connected to an output of the ramp generator for receiving the control signal for canceling the voltage applied to the gate of the floating gate transistor when the memory cell is to be erased.

30. An electrically modifiable non-volatile memory device according to claim 28, wherein the control signal is activated about a few hundred microseconds after the beginning of a duration of the voltage plateau of the first voltage signal.

31. An electrically modifiable non-volatile memory comprising:

an array of memory cells that are read addressable and write addressable by word lines and bit lines, each memory cell comprising a selection transistor and a floating gate transistor series-connected with the selection transistor between a bit line and ground;

a voltage generator for the simultaneous generation of a first voltage signal designed to select a memory cell and a third voltage signal when the memory cell selected is to be programmed, the first voltage signal being applied to the word line attached to the memory cell to be selected and the third voltage signal being applied to a drain of the floating-gate transistor when the memory cell is to be programmed, the two voltage signals each comprises a rising phase, a voltage plateau and a voltage drop; and means to limit a duration of the voltage plateau of the third voltage signal before applying the third voltage signal to a drain of the floating-gate transistor.

32. An electrically modifiable non-volatile memory device according to claim 31, wherein the means to limit a duration of the voltage plateau comprises:

a detection means for generating a detection signal representative of a voltage of a drain of the floating gate transistor when the memory cell is to be programmed; and a ramp generator for receiving the detection signal and for generating a control signal for canceling a voltage applied to the drain when the memory cell is to be programmed.

33. An electrically modifiable non-volatile memory device according to claim 32, further comprising a second control transistor connected to an output of the ramp generator for receiving the control signal for canceling the voltage applied to the drain of the floating gate transistor when the memory cell is to be programmed.

34. An electrically modifiable non-volatile memory device according to claim 32, wherein the control signal is activated about a few hundred microseconds after the beginning of a duration of the voltage plateau of the first voltage signal.

* * * * *

UNITED STATES PATENT AND TRADEMARK OFFICE
CERTIFICATE OF CORRECTION

PATENT NO. : 6,040,994

DATED : March 21, 2000

INVENTOR(S) : David Naura

It is certified that error appears in the above-identified patent and that said Letters Patent is hereby corrected as shown below:

Column 2, Line 2      Strike "vpp"
                      Insert: --"Vpp"--

Column 4, Line 48     Strike "A first uses the"
                      Insert: --"A first approach uses the"--

Signed and Sealed this

Twenty-seventh Day of March, 2001

Attest:

NICHOLAS P. GODICI

Attesting Officer          Acting Director of the United States Patent and Trademark Office